United States Patent [19]

Holdgrafer et al.

[11] Patent Number: 5,205,463
[45] Date of Patent: Apr. 27, 1993

[54] METHOD OF MAKING CONSTANT CLEARANCE FLAT LINK FINE WIRE INTERCONNECTIONS

[75] Inventors: William J. Holdgrafer, Burlington, N.J.; Lee R. Levine, New Tripoli, Pa.; Douglas L. Gauntt, Mickleton, N.J.

[73] Assignee: Kulicke and Soffa Investments, Inc., Wilmington, Del.

[21] Appl. No.: 894,552

[22] Filed: Jun. 5, 1992

[51] Int. Cl.$^5$ .................. H01L 21/60; H05K 3/32
[52] U.S. Cl. ........................... 228/102; 228/179
[58] Field of Search ............ 228/102, 103, 173.5, 228/179, 4.5, 8, 9

[56] References Cited

U.S. PATENT DOCUMENTS

| | | | |
|---|---|---|---|
| 4,068,371 | 1/1978 | Miller | 228/4.5 |
| 4,327,860 | 5/1982 | Kirshenboin et al. | 228/179 |
| 4,445,633 | 5/1984 | Bonham, Jr. | 228/102 |

OTHER PUBLICATIONS

Japanese Publication No. 3-142941 dated Jun. 18, 1991 corresponding to Appln. Ser. No. 1-283335 filed Oct. 30, 1989 by Messers Hiroki and Kawabata; Assigned to Mitubishi Electric Ltd.

*Primary Examiner*—Samuel M. Heinrich
*Attorney, Agent, or Firm*—John B. Sowell

[57] ABSTRACT

A method of pre-forming a length of fine wire while simultaneously making a fire wire interconnection between a first and a second bonding point on a semiconductor device includes the steps of teaching the location of the edges of the die and teaching a plane in space which is located away from the edges of said die. After teaching the height of the clearance above the die and the XYZ location of the first and second bonding points the automatic wire bonder in directed to generate a desired geometric link profile between bonding points which defines the length of links L1, L2 and L3. Using the geometric profile and empirically determined constants the automatic wire bonder calculates a tool trajectory for pre-forming the fine wire while simultaneously making a fine wire interconnection with an automatic wire bonder.

10 Claims, 5 Drawing Sheets

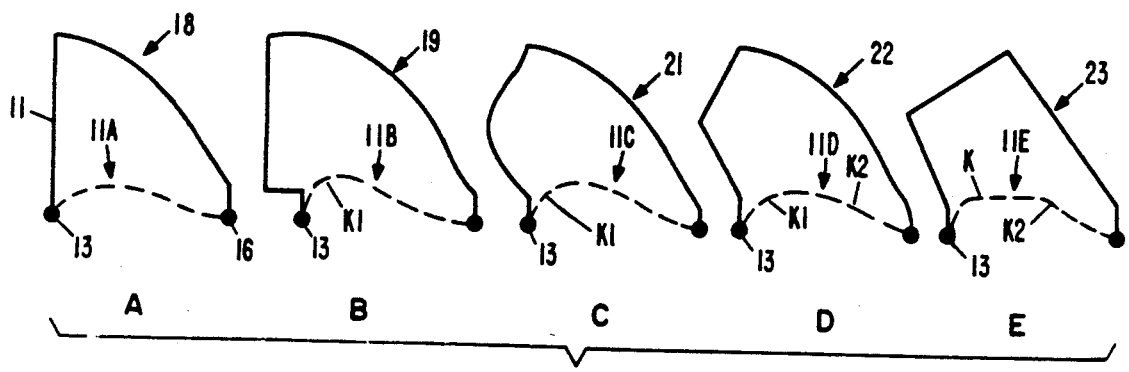
*Figure 2*
*(Prior Art)*
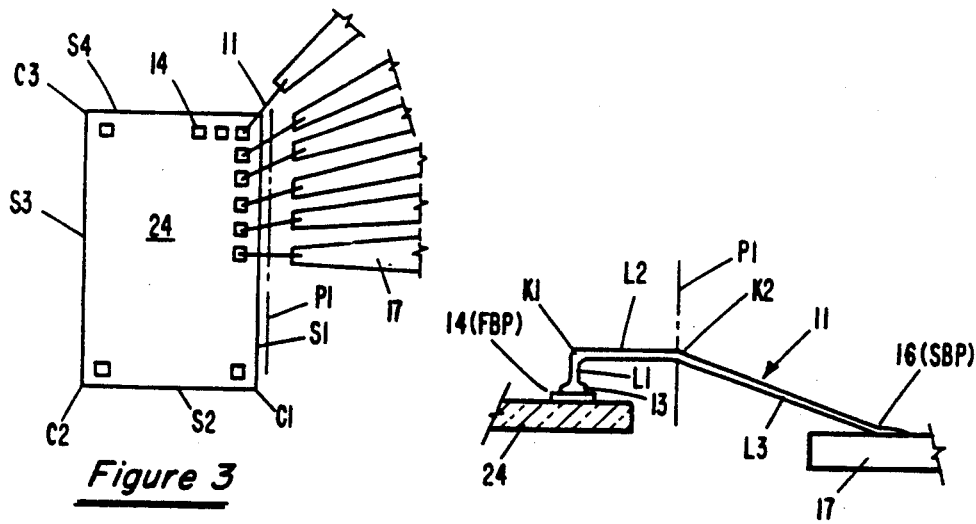
*Figure 3*
*Figure 4*

METHOD OF MAKING CONSTANT CLEARANCE FLAT LINK FINE WIRE INTERCONNECTIONS

BACKGROUND OF THE INVENTION

1. Field of the Invention

The present invention is related to a method of making low profile fine wire interconnections with an automatic wire bonder. More particularly, the present method is preferably employed to make wire interconnections between a pad on a semiconductor device and a lead frame finger of a Thin Small Outline Package (TSOP). Such packages provide only a small separation between the top of the semiconductor die and the top of the package, thus requiring that the fine wire maintain a minimum clearance between the top of the package and the semiconductor die.

2. Description of the Prior Art

Automatic wire bonders for making fine wire interconnections have been commercially available for about two decades. Until recently there were device applications which required extremely thin packages such as Smart Cards, which comprise a small microprocessor or active logic and may comprise some memory which could not be ball wire bonded. Such devices could only be bonded using Tape Automatic Bonding (TAB) or flip-chip bonding techniques or equivalents thereof.

Our U.S. Pat. No. 5,111,989 teaches a method of making low profile fine wire interconnections which may be used with automatic wire bonders to bond such thin package devices. The method taught in this patent is an acceptable solution to bonding low profile devices where the pads on the die are all located at the outer perimeter, thus do not involve die clearance problems. However, when the die or chip has lead out pads that are either internal to the die area or set back from the edge of the die an excessive amount or the die pad bonding point and/or the lead out bonding points require long wire excursions over the die, the fine wire interconnection loop shape causes height interference or probable interference at the edge of the die. If the loop height is increased or looped excessively to clear the die surface and/or the die edge, then the maximum height above the die becomes excessive for the aforementioned TSOP packages.

Accordingly, it would be desirable to provide a method of directing an automatic wire bonder to create a low profile fine wire interconnection with a constant clearance link above a semiconductor die before descending to the second bonding point on the lead frame.

SUMMARY OF THE INVENTION

It is a principal object of the present invention to provide a method of directing an automatic wire bonder to make fine wire interconnections between first and second bond positions with a fine wire having a predetermined programmable geometric profile.

It is a another principal object of the present invention to provide a method of directing an automatic wire bonder to make fine wire interconnections between first and second bond positions to provide a predetermined link geometric profile shape.

It is another principal object of the present invention to provide a method for directing an automatic wire bonder to make a fine wire interconnection which comprises a plurality of substantially straight links in a predetermined geometric profile.

It is another principal object of the present invention to provide a novel method for directing an automatic wire bonder to make predetermined size and shape links $L1$, $L2$, and $L3$ comprising a fine wire interconnection wherein the link $L1$ is bonded orthogonal to the die surface and the link $L2$ is parallel to the die surface.

It is another principal object of the present invention to provide a method which automatically determines the length of the links $L2$ and $L3$ and the total length of the fine wire interconnection comprising three links during a teach operation.

It is another principal object of the present invention to provide a novel method for automatically determining the nominal length of the link $L2$ during a teach process using a selection of alternative methods.

It is another principal object of the present invention to provide a method of automatically determining the length of links $L2$ and $L3$ for each semiconductor device interconnection being automatically wire bonded to compensate for variations between the die pads and the lead frame fingers on different packages and different interconnections.

It is another principal object of the present invention to provide a novel method of automatically preforming kinks in a fine wire used to make a fine wire interconnection between bonding points while paying out the fine wire through a capillary bonding tool of an automatic wire bonder.

It is another object of the present invention to provide a method of automatically pre-forming a kink $K1$ between links $L1$ and $L2$ and a kink $K2$ between links $L2$ and $L3$ during a bonding operation with an automatic wire bonder.

It is another object of the present invention to provide a novel method of making predetermined geometric link profiles absolutely consistent by making the kinks $K1$ and $K2$ at predetermined points on a fine wire interconnection so as to minimize the unkinking of the kinks $K1$ and $K2$ during a bonding operation.

It is another object of the present invention to provide a novel method for making a fine wire interconnection wherein the wire clamps of the wire bonder may be closed at kinks $K1$ and $K2$ as a user selectable option without a change in the bonding time of an automatic wire bonder.

It is another object of the present invention to provide a novel method of making a fine wire interconnection wherein the capillary bonding tool descent path to second bond is defined as an arcuate path which compresses the fine wire interconnection and shapes the links $L1$, $L2$ and $L3$ and the kinks $K1$ and $K2$ before making the second bond.

It is another object of the present invention to provide a novel method of automatically determining the kink points $K1$ and $K2$ in space for a bonding tool making a fine wire interconnection having links $L1$, $L2$ and $L3$ formed at desired intersecting angles.

According to these and other objects of the present invention, there is provided an automatic wire bonder for making a fine wire interconnection between the first and second bonding pad on a semiconductor device to be bonded. The method comprises teaching the automatic wire bonder the X,Y and Z positions of the locations of the desired bonding points at first and second bond and instructing the processor of the automatic wire bonder to compute a desired three link geometric profile for each of the fine wire interconnections to be made between the first and second bonding points. The novel steps include generating in the processor the lengths of the links L1, L2 and L3, the kink points K1 and K2 and their intersecting angles in a predetermined geometric profile while paying out a predetermined length of fine wire and simultaneously moving from first bond to the second bond position.

BRIEF DESCRIPTION OF THE DRAWINGS

FIGS. 2A-2E show simplified schematic diagrams of a plurality of prior art tool trajectory profiles programmed into commercially available automatic wire bonders and such profiles are user selectable and configurable for making different loop geometric profiles;

FIG. 3 is a schematic diagram and plan view of a typical die on a prior art lead frame;

FIG. 4 is a an enlarged side elevation of a constant clearance flat link geometric profile fine wire interconnection of the present invention used to make low profile fine wire interconnections;

DESCRIPTION OF THE PREFERRED EMBODIMENT

In the preferred embodiment of the present invention, the fine wire to be interconnected between a first bond on a paid of a semiconductor die to a second bond position on the finger of a lead frame can easily be made by looping the fine wire so as to provide a high profile interconnecting loop without kinks between the bonding points. When it is desirable to provide low profile interconnection with a kink intermediate to the bonding points, it is necessary to form the kink at a predetermined point on the wire with a predetermined set or pre-form which become partially unkinked or accentuated during the wire bonding process, accordingly it is necessary to form kinks and bends at the intersection of links which change during the bonding process.

Figure 1:
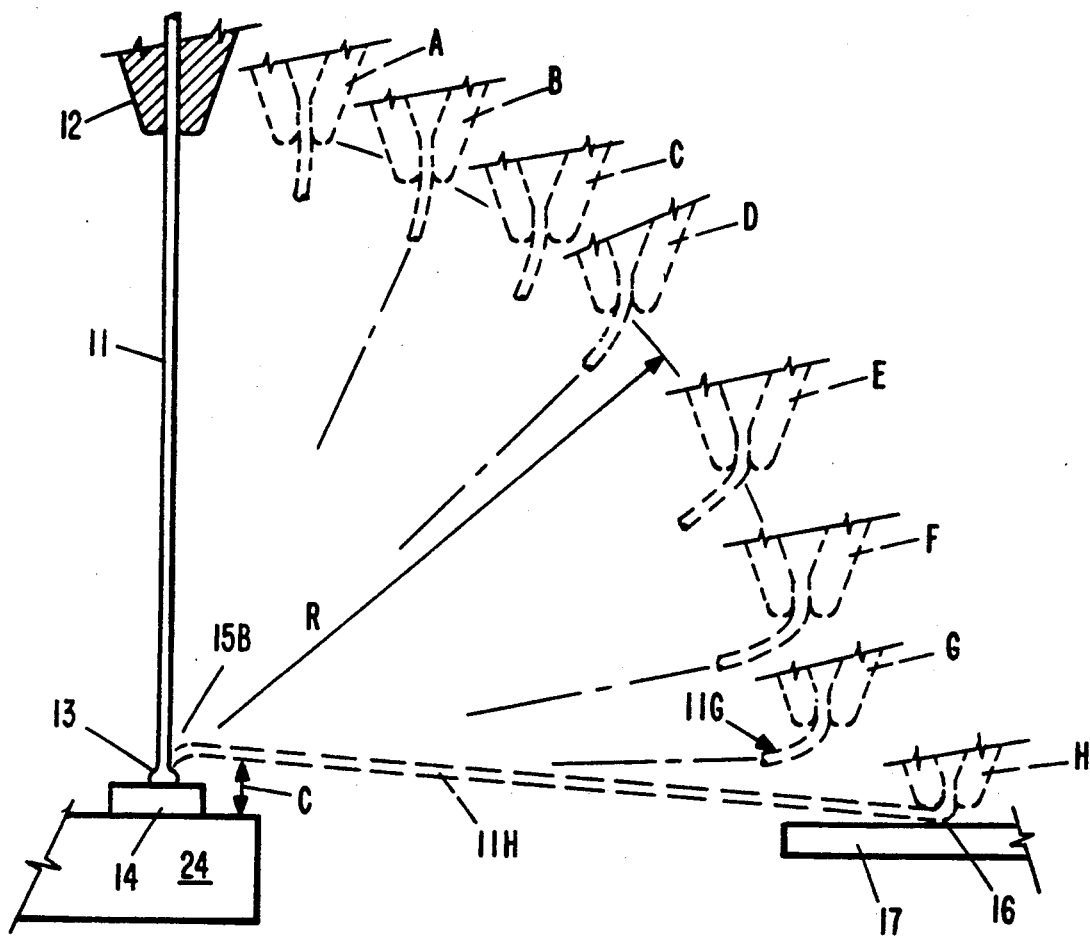
FIG. 1 is a schematic diagram showing a most recent prior art tool path taken by a capillary bonding tool of an automatic wire bonder to make low profile slack free fine wire interconnections.

Refer now to FIG. 1 showing in schematic diagram the path taken by a capillary bonding tool when making a low profile slack free wire interconnection with no pre-formed kinks. This same diagram is shown and described in Kulicke & Soffa Industries, Inc. U.S. Pat. No. 5,111,989, the same assignee as the assignee of the present invention. The preferred method path taken by the capillary bonding tool 12 comprises raising the capillary bonding tool 12 vertically to the position shown to pay out an exact predetermined length of fine wire 11 which is actually shorter than the length of the wire needed in the final interconnection or loop shown as 11H. In this prior art method, the length of wire is critical and the wire is clamped above the capillary bonding tool 12 by wire clamps (not shown) before the bonding tool 12 is moved through the arcuate path shown by positions A through H which terminate at the second bonding point 16 on a finger of the lead frame 17. In this prior art method, the bonding tool reaches a final bonding touch down position which is short of the position H. After touching down, a first bonding force is applied to the bonding tool 12 and the bonding tool is moved to the right toward position H where a second and final bonding force with applied ultrasonic motion is applied to finish making the second bond. It will be noted that an arcuate path is shown by radius R. It is only necessary that the path taken by the bonding tool 12 be approximately equal to or less than the radius R so as to prevent exerting tension forces on the wire 11 in its movement from position A to G. Excessive tension in the wire 11 would create stresses in the bend 15B above the ball 13 on the first conductive pad 14. However, the proper amount of tension and movement between the capillary bonding tool and the second bonding point 16 at position 12H prevents backward extrusion which would cause a kick-up of the wire 11H. While the low profile interconnection shown in FIG. 1 is desirable for semiconductor devices having pads 14 close to the edge of the die, the clearance C cannot be maintained at a proper distance when the pads 14 are on the interior of the die.

Refer now to FIGS. 2A to 2E showing a plurality of prior art tool trajectory profiles that have been programmed into a Kulicke and Soffa Industries Inc. model 1484 automatic wire bonder. FIG. 2A shows the wire trajectory profile 18 which begins at the ball 13 at the first bonding point and proceeds vertically, then arcuately and downwardly to the second bonding point. As explained herein before, the fine wire 11 is paid out and clamped at the top of the rise of the capillary bonding tool 12 Following the trajectory shown in profile 18, a low loop interconnecting wire 11A shown in phantom lines is produced between the bonding points 13 and 16. In similar manner, when the capillary bonding tool 12 is first directed into a reverse motion as shown in FIG. 2B before rising vertically the trajectory path 19 produces an interconnecting wire loop approximating that shown at interconnection 11B. When the trajectory path 21 shown in Figure C is employed by the automatic wire bonder, a kink point K1 is produced and a fatter or higher interconnecting wire loop 11C is produced. When the trajectory path 22 shown in FIG. 2D is employed by the automatic wire bonder a interconnecting wire 11D is produced that is similar to the loop shown in FIG. 2C but has a pronounced bend at point K2. The trajectory profile 23 shown in FIG. 2E produces a flatter profile interconnecting wire 11E with bend points K1 and K2.

The trajectory profiles shown in FIG. 2 provide interconnecting loops that are configurable by inputting the distance information between the bonding points 13 and 16 and the height from the ball 13 to the first bend point K1 and the amount of set back or reversed motion from the bend point K1 before rising to the full loop height to payout the desired length of interconnecting wire.

Refer now to FIG. 3 showing a plan view of a typical die 24 having a plurality of bonding pads 14 and lead fingers 17 which are interconnected by fine wires 11 using an automatic wire bonder The automatic wire bonder is taught the corners C1, C2 and C3 of the die 24. The corners C1, C2 and C3 define the sides S1, S2, S3 and S4 in space. Having defined the sides S1 to S4 in space, it is now possible to generate artificial offset lines in space P1 etc. which are at a predetermined distance from the edges S1-S4 of the die and are intermediate the first and second bonding points As is well known, the bonding location of the pads 14 and finger 17 may be programmed into the automatic wire bonder by manually teaching the bonding points or may be automatically programmed using a state of the art pattern recognition system which is shown and described in our U.S. Pat. No. 5,119,436.

Refer now to FIG. 4 showing an enlarged side elevation of one of the interconnection wires of FIG. 3 having a constant clearance flat geometric profile fine wire interconnection between the first bonding point 14 and the second bonding point 16 on finger 17. In the preferred embodiment of the present invention, the interconnecting wire 11 is formed by three links L1, L2 and L3 having kink points K1 and K2. It will be noted that the kink point K2 is formed exactly over the outer perimeter line plane in space P1 which was programmed into the automatic wire bonder to generate a clearance line in space.

Figure 5:
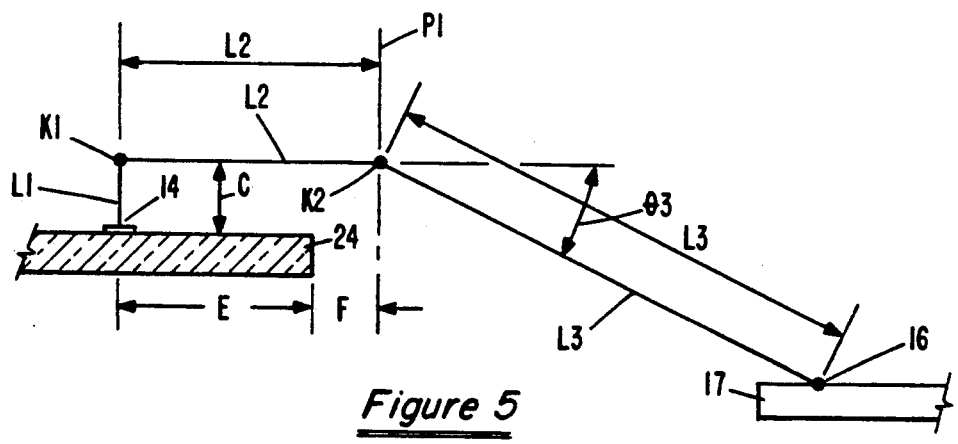
FIG. 5 is a an enlarge schematic diagram in side elevation of the geometric profiles shown in FIG. 4 illustrating the three links L1, L2 and L3 which define kink points K1 and K2.

Refer now to FIG. 5 showing an enlarged schematic diagram in side elevation of the interconnecting wire 11 shown in FIG. 4 illustrating the three links L1, L2 and L3 which define the kink points K1 and K2. The link L2 is shown having a large excursion E which extends over the surface of the die 24 before reaching the kink point K2 and then descending substantially straight to the second bonding point 16 on the lead frame 17. It is desirable in the preferred embodiment of the present invention that the links L1, L2 and L3 be substantially straight and form kink points or intercepting angles such as angle theta 3 between link L2 and L3 which are definable. It is possible knowing the XYZ location of the bonding point 14 and the XYZ location of the bonding point 16 to determine the desired lengths of links L2 and L3 after having programmed the height L1 into the automatic wire bonder to produce the clearance C. As will be explained hereinafter, the kink point K2 is calculated by the automatic wire bonder to occur at the peripheral edge or plane and space P1.

Once the clearance C, first and second bonding points 14 and 16 and the P1 point in space are known the lengths L1, L2, L3 and theta 3 are calculated automatically by the processor in the automatic wire bonder. It will be understood that the sum of the links L1 through L3 comprise the amount of wire to be used in the interconnection.

Figure 6:
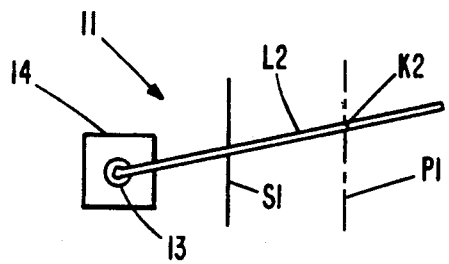
FIG. 6 is a schematic diagram in plan view of a fine wire interconnection having a kink point K2 which is pre-formed to occur at a predetermined plane and space.

FIG. 6 is an enlarged schematic diagram in plan view of an end of the fine wire interconnection shown in FIGS. 4 and 5 which extends from the first bonding pad or point 14 to the kink point K2 which is defined in space by the extended peripheral edge or plane and space P1.

Figure 7:
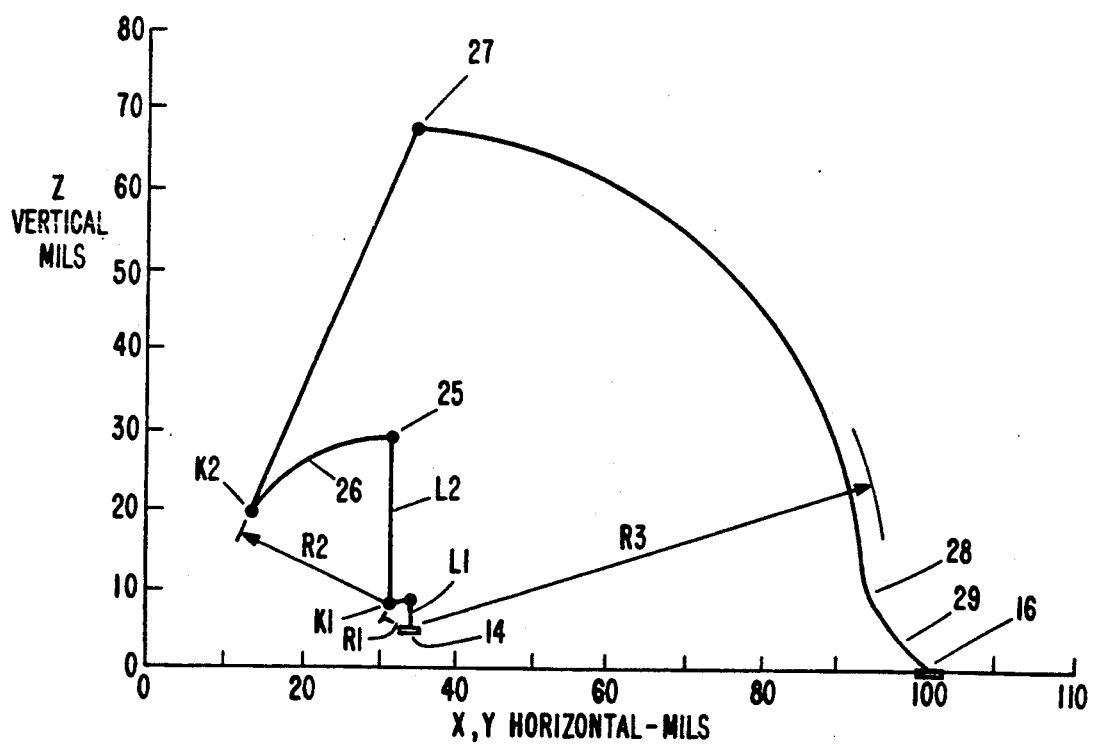
FIG. 7 is a schematic diagram of a trajectory profile of a preferred embodiment of the present invention method illustrating the reshaping of the kink points K1 and K2 during a bonding operation.

Refer now to FIG. 7 showing a schematic diagram of a trajectory profile of a preferred embodiment of the present invention which illustrates the forming and reshaping of the kink points K1 and K2 during a bonding operation. A ball bond 13 is made on the first bonding point 14. The capillary bonding tool then proceeds vertically upward a first distance L1 where it is desired to make a kink point K1. The capillary bonding tool is directed in a reverse motion away from the second bond position 16 in a preferred arcuate path R1 which does not change the amount of wire paid out of the capillary tool and proceeds to bend the wire until reaching the first kink point K1. In the preferred embodiment of the present invention, the capillary bonding tool 12 is then raised substantially vertically to pay out an additional length of wire L2 as shown at point 25. In the preferred embodiment of the present invention, the capillary bonding tool is then directed in a reverse motion arcuate path having a focal point at kink point K1 defined by radius R2. The kink point K2 is preferably made without having to pay out or take in additional wire from or to the capillary bonding tool and for this purpose it may be desirable to close the wire clamps if a large kink or large excursion is being made. It will be noted that the arcuate path 26 is both horizontally away from the second bonding point 16 and downward and if properly made, all of the bending of the link L2 occurs at the kink point K2. Having formed the kink point K2, the trajectory profile of the preferred embodiment of the present invention is then along the shortest distance from kink point K2 to the top of the loop 27 and is preferably directly above, or lose to directly above, the first bonding point 14. At point 27, the wire clamps are closed so that no wire is permitted to pay out or enter the capillary bonding tool 12.

In the preferred embodiment of the present invention, the automatic wire bonder is then directed along an arcuate path which is inside the radius R3 having a focal point at the bonding point 14. The arcuate path 27-28 terminates at point 28 which is an inflection point for starting to stretch out the interconnecting wire. The bonding tool then proceeds to its constant velocity inflection point shown at point 29 and makes a constant velocity excursion down to the bonding point 16 where the second bond is made. It will be understood that the arcuate path 27-28 bends and compresses the interconnecting wire thus, the interconnecting wire is being reshaped and formed at the kink angles and the kink points K1 and K2 are being further accentuated before reaching the inflection point 28 at which time the amount of kink or angle at the kink points K1 and K2 is partially unkinked At point 28 the amount of angle at kink point K1 is substantially defined. During the excursion from point 28 to the bonding point 16, the amount of angle at kink point k2 is unkinked and finalized.

Figure 8:
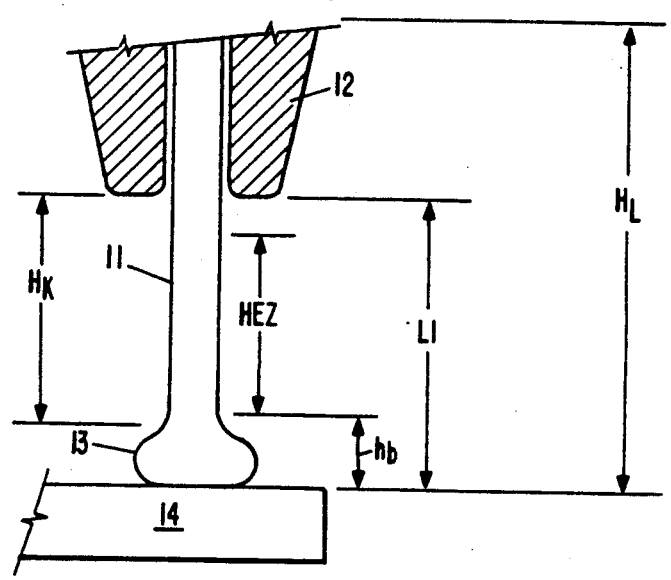
FIG. 8 is a an enlarged schematic diagram of a fine wire interconnection made at the first bond position.

Refer now to FIG. 8 showing an enlarged schematic diagram of a fine wire interconnection which is made at the first bond position 14. The ball 13 is shown having a ball height $H_b$. The ball was made by melting an end of the wire 11 which creates a heat effected zone HEZ that rises to approximately 7 mils above the ball 13. In the prior art it was the preferred practice to form any bend above the heat effected zone because the heat effected zone was softer than the cold drawn wire above the heat affected zone. The present invention kink height $H_k$ for K1 can be made in the heat effected zone HEZ. The length of link L1 includes the height of the ball and the kink height $H_k$. After the kink is made in the wire 11 as will be explained hereinafter, the bonding capillary 12, rises to the top of the loop height 27 describe hereinbefore and shown as the loop height $H_L$. Having described these heights and the nomenclature to be used, it will now be understood that it is possible employing the present invention to produce the kink K1 at any height L1 even when the kink K1 is in the portion of the heat affected zone. This is possible because the kink K1 is formed in the wire by a preferable arcuate path movement which defines the kink point in such a manner that it is insensitive to the hardness or softness of the wire 11.

Figure 9:
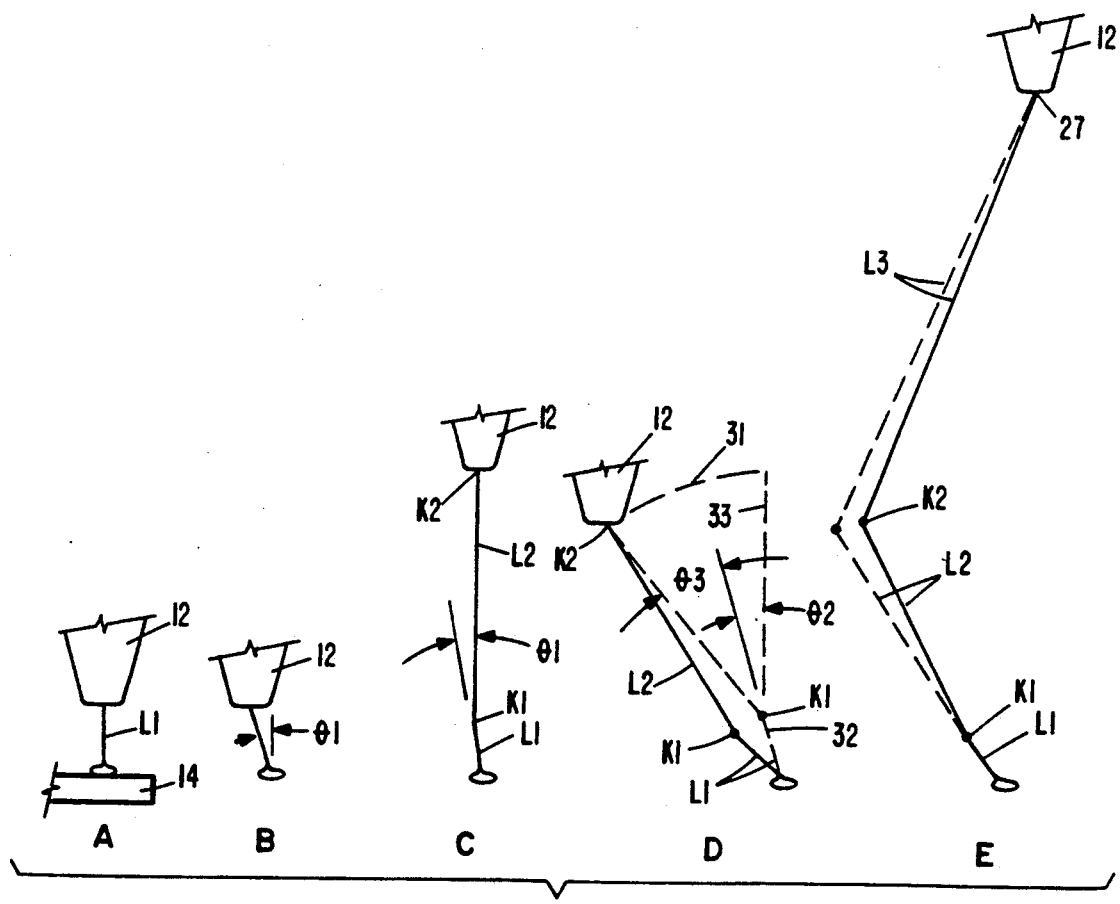
FIGS. 9A to 9E are schematic diagrams of the position of the capillary bonding tool during the formation of the kink points K1 and K2.

Refer now to FIGS. 9A through 9E showing schematically the position of the capillary bonding tool 12 during the formation of the desired kink points K1 and K2. FIG. 9A shows a first bond made on the bonding point 14 after the capillary bonding tool 12 has risen to the full kink height L1. At this point in space, capillary bonding tool is moved in a reverse motion away from the second bond position along an arcuate path to define an angle theta 1 which is empirically derived from extensive experimentation and tests. As a typical example for a low profile interconnect, the angle theta 1 was found to be a constant and varies between 30° and 45° as shown in FIG. 9B. FIG. 9C shows the angle theta 1 defined at the kink point K1 and the intersection of the link L1 and L2 as being substantially unchanged when the capillary bonding tool 12 rises to the kink point K2 which defines the link L2.

Refer now to FIG. 9D showing the capillary bonding tool 12 moved along an arcuate path 31 to a point in space where the kink K2 is completely pre-formed. At this point in space the links L1 ad L2 are moved from their phantom lines 32 and 33 to their actual full position lines showing the links L1 and L2 and the kink points K1 and K2. In order to determine how far to move the capillary bonding tool 12 along the arcuate path 31, it is necessary to calculate the aforementioned angle theta 3 shown in FIG. 5 as the intersecting angle between links L2 and L3. In order to form the desired kink angle using K1 as the pivot point, it was found necessary to move along the arcuate path 31 a distance defined by the angles theta 3 plus theta 2. Theta 3 was mathematically derived and theta 2 is empirically derived using increasing amounts of arcuate movement along path 31 until the desired profile is obtained. It was found that the angle theta 2 becomes a constant for a wide range of wire sizes and wire types used on similar devices and is programmably selectable.

Refer now to FIG. 9E showing the bonding tool 12 moved to its full loop height at point 27. FIG. 9E has the actual final links L1, L2 and L3 shown in solid lines and the approximate shape of the wire when the bonding tool 12 was preceding from the kink point K2 to the loop height 27 in phantom lines. It will be noted there is some spring in the wire which causes movement and it should be anticipated. Having once reached the loop height point 27, the wire is clamped by wire clamps (not shown) to prevent movement of the wire 11 in the capillary 12 prior to proceeding along a trajectory profile of the type shown in FIG. 7 to the second bonding point where the second bond is completed.

Figure 10:
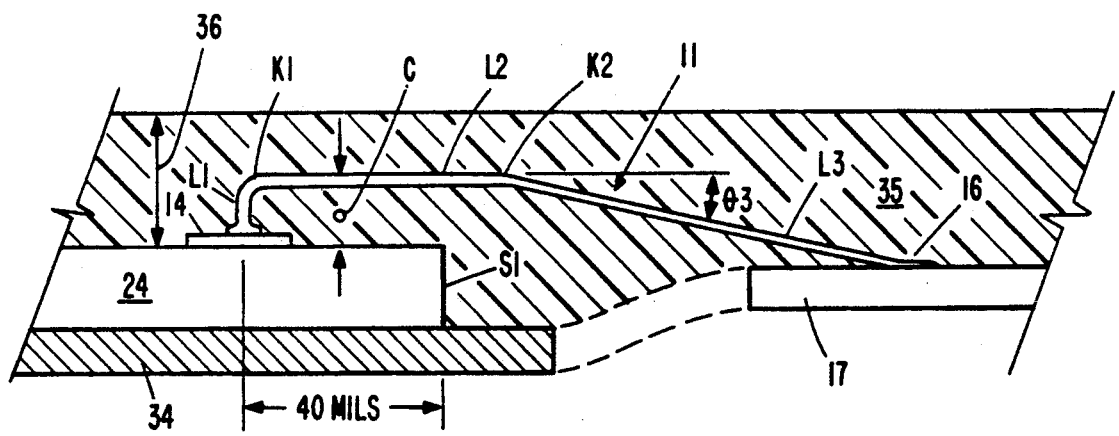
FIG. 10 is a schematic diagram in side elevation of a low profile fine wire interconnection made by the present invention on a thin small outline package and having a large excursion of fine wire over the surface of the semiconductor die.

Refer now to FIG. 10 showing a schematic diagram in side elevation and section of a low profile fine wire interconnection after being encapsulated in a Thin Small Outline Package. The die paddle 34 is part of the metal lead frame which comprises the lead finger 17 on which the second bonding point 16 is made. The die paddle supports a die 24 having a pad or first bonding point 14 on which the first bond is made. The links L1, L2 and L3 are shown in a geometric configurations which defines the angle theta 3. The angle from kink point K2 to bonding point 16 can be abrupt and up to approximately 45°. The distance from the side S1 of the die 24 to the bonding point 14 can be up to 40 mils and it is desirable to maintain the clearance C of the link L2 above the top of the die surface 24 at approximately 5 mils ± 1 mil in a typical device. Further, it is desirable to maintain the package clearance 36 at approximately 15 mils so that the clearance above the link L2 will be approximately 10 mils. The completed interconnected pre-formed wire having links L1, L2 and L3 is encapsulated in potting material 35. To produce this configuration or a similar configuration it is necessary to maintain exact length in the links L1, L2 and L3. The lengths are established by the automatic wire bonder during the teach operation using the geometric profile points in space as well as values manually previously programmed into the automatic wire bonder before the program performs the other calculations.

Having described a preferred embodiment of the present invention, it will be understood that the depth of the incapsulant or potting compound may vary from one device to another but once established for a device the wire height can be maintained within plus or minus 1 mils for 3 sigma deviation which is one part in 30,000 or 300 ppm.

A feature of the present invention is that during the teach operation of any new device it is only necessary to enter two new inputs which comprise the corners of the die and the peripheral clearance distance F to P1 etc. because the height of the kink point K1 was already previously programmed but did not include a kink height low enough to be formed in the heat affected zone. Thus, employing the present method it is possible to produce a predetermined straight link geometric profile having a constant clearance C above a die surface which permits bonding interior points on the die which were not easily wire bonded with low profile interconnections before. The angles theta 1 and theta 2 were empirically derived and may be preprogrammed as constants in the automatic wire bonder for similar devices, thus are not entered as parameters for making the novel interconnect. The angle theta 3 is automatically computed for each of the wire interconnects based on the L2 and L3 lengths and the interconnecting point K2.

It should be understood that a small amount of deviation from a customer critical specification does not necessarily produce an unusable device and that the target parameters and the sigma deviation are standards by which the automatic wire bonder is programmed and tested against. All of the devices that are wire bonded using the present method are considered to be usable devices

What is claimed is:

1. A method of directing an automatic wire bonder to make a fine wire interconnection between a first and a second bonding pad on a semiconductor device to be bonded and to simultaneously pre-forming said fine wire, comprising the steps of:

teaching the automatic wire bonder the X,Y and Z locations of the desired bonding points at the first and second bonding pads of the semiconductor device to be bonded, generating in the processor of the automatic wire bonder a desired three link geometric profile of each of the wire interconnections to be made between bonding points, generating in the automatic wire bonder the lengths of the links L1, L2 and L3 and the kink angle theta 3 between the links L2 and L3 in said geometric profile, bonding an end of a fine wire to the first bonding point employing a capillary bonding tool on the automatic wire bonder, pre-forming kinks K1 and K2 in said fine wire while simultaneously paying out said predetermined lengths of wire L1, L2 and L3, said first link L1 being pre-formed by raising said bonding tool vertically to pay out a length of wire equal to the clearance height of link L1, moving said bonding tool horizontally and vertically downward to form a kink K1 at length L1 of said fine wire, pre-forming said second link L2 by raising said bonding tool substantially vertically from kink point K1 to pay out a length of wire equal to length L2, moving said bonding tool horizontally and vertically downward along an arcuate path to form a kink K2 at length L2 of said fine wire, pre-formed and said third link L3 by raising said bonding tool vertically and horizontally to pay out a length of fine wire equal to link L3, clamping said fine wire from further movement in said capillary bonding tool, moving said bonding tool horizontally and vertically downward in an arcuate path to the desired second bond position while simultaneously bending said fine wire at said kink points K1 and K2 for producing said three link geometric profile interconnecting wire, and bonding said fine wire to said second bonding point.

2. A method as set forth in claim 1 wherein the step of forming said second kink K2 by moving said bonding tool horizontally and vertically downward further comprises moving said bonding tool in an radial path having a focal point approximately at kink point K1 to form a kink K2 at length L2 and preventing said fine wire from moving into or out of said capillary bonding tool.

3. A method as set forth in claim 1 wherein the step of pre-forming said third link L3 comprises the step of moving said bonding tool in a shortest distance path to a point substantially above said first bonding point 4. A method as set forth in claim 2 wherein the step of moving said bonding tool in a arcuate path comprises forming a kink angle theta 2 plus theta 3 at kink point K2 which substantially exceeds the desired kink angle theta 3 in said three link geometric profile interconnecting wire.

5. A method as set forth in claim 4 wherein said kink angle at kink point K2 comprises an empirically determined theta 2.

6. A method as set forth in claim 5 wherein the kink angle theta 2 is calculated during a teach operation and one of said angles theta 2 representative of a typical wire interconnection is selected and stored as a constant kink angle theta 2 for all wire interconnections on similar typical devices.

7. A method of directing an automatic wire bonder to make a fine wire interconnection between the first and the second bonding pad on a semiconductor device to be bonded and for simultaneously pre-forming said fine wire, comprising the steps of:

teaching the automatic wire bonder the X,Y and Z locations of the desired first and second bonding points at the first and second bonding pads of the semiconductor device to be bonded and the length of link L1, generating in said memory lines and space representative of the edges of said semiconductor device as viewed from a top or plane view, generating in the memory of said automatic wire bonder hypothetical device edge lines in space between the first and second bonding points which are parallel to and removed from the edge of said semiconductor device at a point where it is desired that links L2 and L3 form a kink angle point, generating in the memory of the automatic wire bonder a desired three link geometric profile of each of the wire interconnections to be made, generating and storing in said memory the lengths of links L1, L2 and L3 and an angle theta 3 representative of the value between the axes of the links L2 and L3 in space as viewed in side elevation, said step of generating and storing in said memory the link L2 comprising the steps of calculating the X,Y distance from said first bonding point to the X,Y kink point in space where the axes of link L2 intersects at hypothetical device edge line between said first and second bonding points, said steps of generating and storing in said memory the link L3 comprising the steps of calculating the X,Y and Z distance from said second bonding point to said X,Y point in space where the axes of link L2 intersects the hypothetical device edge line, calculating a first point K1 and a second point K2 in space for forming the kinks in links L1 to L3, making a first wire bond on a first pad of a semiconductor device to be bonded, directing the automatic wire bonder to move its bonding tool along a predetermined path from a first pad to a second pad of the semiconductor device to be bonded, simultaneously pre-forming said links L1, L2 and L3 at kink points K1 and K2 in space, and making a second wire bond on the second pad of said semiconductor device to be bonded so that the links L1, L2 and L3 form said three link geometric profile.

8. A method as set forth in claim 7 wherein the length of the link L1 is entered into said memory as a predetermined constant representing the clearance height of the first bond on said semiconductor device.

9. A method as set forth in claim 8 wherein the length of link L2 is automatically calculated by said automatic wire bonder as the distance between the first bonding point K1 on link L1 and the hypothetical device edge line in space.

10. A method as set forth in claim 9 wherein the length of link L3 is automatically calculated by said processor as the distance between the link L2 and the second wire bond.

* * * * *